(12) United States Patent
Jeong (10) Patent No.: US 6,949,466 B2
(45) Date of Patent: Sep. 27, 2005

(54) CMP APPARATUS AND METHOD FOR POLISHING MULTIPLE SEMICONDUCTOR WAFERS ON A SINGLE POLISHING PAD USING MULTIPLE SLURRY DELIVERY LINES

(75) Inventor: In Kwon Jeong, Sunnyvale, CA (US)

(73) Assignee: Oriol Inc., Santa Clara, CA (US)

( * ) Notice: Subject to any disclaimer, the term of this patent is extended or adjusted under 35 U.S.C. 154(b) by 76 days.

(21) Appl. No.: 09/956,451

(22) Filed: Sep. 18, 2001

(65) Prior Publication Data

US 2003/0054648 A1 Mar. 20, 2003

(51) Int. Cl.[7] .............................................. H01L 21/20
(52) U.S. Cl. ...................... 438/691; 438/692; 438/695
(58) Field of Search ................................ 438/691, 692, 438/695

(56) References Cited

U.S. PATENT DOCUMENTS

| | | | |
|---|---|---|---|
| 5,738,574 A | | 4/1998 | Tolles et al. |
| 5,837,610 A | * | 11/1998 | Lee et al. .................. 438/692 |
| 5,924,916 A | * | 7/1999 | Yamashita .................. 451/288 |
| 6,066,030 A | * | 5/2000 | Uzoh ........................... 451/41 |
| 6,096,162 A | | 8/2000 | Lin et al. |
| 6,136,715 A | | 10/2000 | Shendon et al. |
| 6,319,098 B1 | * | 11/2001 | Osterheld et al. ............. 451/54 |
| 6,368,955 B1 | * | 4/2002 | Easter et al. ................ 438/633 |
| 6,380,069 B1 | * | 4/2002 | Chen et al. .................. 438/692 |
| 6,398,627 B1 | * | 6/2002 | Chiou et al. .................. 451/72 |

FOREIGN PATENT DOCUMENTS

| | | |
|---|---|---|
| JP | 2001-18161 | 1/2001 |
| JP | 2001-18169 | 1/2001 |
| WO | WO-99/26763 A2 | 6/1999 |

* cited by examiner

Primary Examiner—Robert Kunemund
(74) Attorney, Agent, or Firm—McKenna Long & Aldridge LLP (57) ABSTRACT

A chemical mechanical polishing (CMP) apparatus and method for sequentially polishing multiple semiconductor wafers on a single polishing pad utilizes multiple slurry delivery lines to supply one or more types of polishing solutions to the surface of the polishing pad. The slurry delivery lines are positioned to direct the polishing solution or solutions to different polishing positions of the polishing pad. The use of multiple slurry delivery lines allows the CMP apparatus to polish the semiconductor wafers at different polishing positions of the polishing pad using different types of polishing solutions.

25 Claims, 5 Drawing Sheets

CMP APPARATUS AND METHOD FOR POLISHING MULTIPLE SEMICONDUCTOR WAFERS ON A SINGLE POLISHING PAD USING MULTIPLE SLURRY DELIVERY LINES

FIELD OF THE INVENTION

The invention relates generally to semiconductor wafer processing, and more particularly to a chemical mechanical polishing apparatus that can polish multiple semiconductor wafers on a single polishing pad.

BACKGROUND OF THE INVENTION

Chemical mechanical polishing (CMP) is a well-accepted technique to planarize the surface of a semiconductor wafer during fabrication of a semiconductor device. In CMP, planarization is achieved by chemically and mechanically removing uneven topographic features of a semiconductor wafer. A conventional CMP technique involves polishing the surface of a semiconductor wafer with a rotating polishing pad using slurry of colloidal particles in an aqueous solution, which is supplied to the surface of the polishing pad through a slurry delivery line. The slurry promotes planarization of the wafer surface by producing a chemical reaction with the wafer surface and by providing abrasives to "grind" the wafer surface with the polishing pad.

Some conventional CMP apparatuses include a single small polishing pad to polish one semiconductor wafer at a time. Other conventional CMP apparatuses include a number of small polishing pads to polish multiple semiconductor wafers in parallel to increase the throughput of the apparatus. However, the CMP apparatuses with multiple polishing pads require a large footprint, due to the large area required by the multiple polishing pads. Thus, CMP apparatuses have been developed that include a large polishing pad to simultaneously polish multiple semiconductor wafers. These multi-wafer CMP apparatuses typically utilize a wafer transfer carousel with a number of wafer carriers, so that multiple semiconductor wafers can be polished on the large polishing pad using appropriate slurry.

During fabrication of a semiconductor device, a semiconductor wafer may have to be repeatedly CMP planarized. Depending on the features of the semiconductor wafer being polished, the sequential CMP planarizations may need to be performed using different types of slurries. For example, when a semiconductor wafer is polished using slurry with coarse abrasives, the polished wafer may be further polished using slurry with finer abrasives to achieve a smoother planarized wafer surface. As another example, for fabrication of Cu interconnections, a first type of slurry is used to polish Cu plugs, and then, a second type of slurry is used to polish Ta or TaN barrier layer. When different types of slurries are used for sequential CMP planarizations, each planarization is typically performed on a different CMP apparatus. Thus, multiple CMP apparatuses may be needed to sequentially planarize each semiconductor wafer.

A concern with the use of multiple CMP apparatuses for the sequential CMP planarizations is that the CMP apparatuses may require a substantial amount of valuable real estate in a cleanroom. Another concern is that semiconductor wafers must be transferred from one CMP apparatus to the next CMP apparatus, which can delay the overall fabrication process.

In view of the above concerns, there is a need for a CMP apparatus and method for sequentially polishing semiconductor wafers on a single polishing pad using different types of polishing solutions so that additional CMP apparatuses are not needed, and consequently, the amount of space required in a cleanroom can be significantly reduced.

SUMMARY OF THE INVENTION

A chemical mechanical polishing (CMP) apparatus and method for sequentially polishing multiple semiconductor wafers on a single polishing pad utilizes multiple slurry delivery lines to supply one or more types of polishing solutions to the surface of the polishing pad. The slurry delivery lines are positioned to direct the polishing solution or solutions to different polishing positions of the polishing pad. The use of multiple slurry delivery lines allows the CMP apparatus to polish the semiconductor wafers at different polishing positions of the polishing pad using different types of polishing solutions.

A CMP apparatus in accordance with the present invention includes a polishing pad having a surface to polish semiconductor wafers, an object transfer mechanism having wafer carriers that are each configured to hold at least one semiconductor wafer, and a number of delivery lines that extend to the surface of the polishing pad. The object transfer mechanism is configured to move the wafer carriers to polishing positions of the polishing pad. The object transfer mechanism may be a carousel that is configured to rotate the wafer carriers to the polishing positions of the polishing pad. The delivery lines of the apparatus are connected to a polishing solution supply. In addition, each of the delivery lines is positioned to supply a particular polishing solution from the polishing solution supply to the surface of the polishing pad.

The delivery lines may be configured such that each delivery line is positioned to direct the particular polishing position toward a corresponding polishing position of the polishing pad so that the particular polishing solution is distributed to the corresponding polishing position as the polishing pad is rotated. Furthermore, each of the delivery lines may be positioned to expel the particular polishing solution in an outwardly radial direction onto the surface of the polishing pad. In an exemplary embodiment, the number of delivery lines corresponds to the number of the wafer carriers of the object transfer mechanism.

In an embodiment, the polishing solution supply includes a first type of slurry and a second type of slurry. The second type of slurry may have finer abrasives than the first type of slurry. In this embodiment, the first type of slurry and the second type of slurry may be chemically compatible so that the first type of slurry and the second type of slurry can be simultaneously used on the polishing pad without an undesirable chemical reaction.

A method in accordance with the present invention includes the steps of supplying polishing solutions onto a surface of a polishing pad near polishing positions of the polishing pad through a number of delivery lines, and polishing semiconductor wafers at the polishing positions of the polishing pad using the polishing solutions that are supplied to the surface of the polishing pad through the delivery lines. The delivery lines are connected to a polishing solution supply to carry the polishing solutions from the polishing solutions supply to the surface of the polishing pad. The delivery lines are configured such that each delivery line is positioned to deliver a particular polishing solution to the surface of the polishing pad. In an exemplary embodiment, the number of delivery lines corresponds to the number of polishing positions of the polishing pad.

The step of supplying the polishing solutions may include selectively directing the particular polishing solution to a specific polishing position of the polishing pad. In addition, the step of supplying the polishing solutions may include expelling the polishing solutions in an outwardly radial direction onto the surface of the polishing pad through the delivery lines.

The method may further include a step of transferring each of the semiconductor wafers from a first position of the polishing positions to a second position of the polishing positions so that the semiconductor wafers are polished at the first and second positions. The step of transferring each of the semiconductor wafers may include rotating the semiconductor wafers about the polishing pad to the first and second positions of the polishing pad.

In an embodiment, the step of supplying the polishing solutions includes supplying a first type of slurry onto the surface of the polishing pad through a first delivery line, and supplying a second type of slurry onto the surface of the polishing pad through a second delivery line. The second type of slurry may have finer abrasives than the first type of slurry. In this embodiment, the first type of slurry and the second type of slurry may be chemically compatible so that the first type of slurry and the second type of slurry can be simultaneously used on the polishing pad without an undesirable chemical reaction.

Other aspects and advantages of the present invention will become apparent from the following detailed description, taken in conjunction with the accompanying drawings, illustrated by way of example of the principles of the invention.

DETAILED DESCRIPTION OF THE INVENTION

Figure 1:
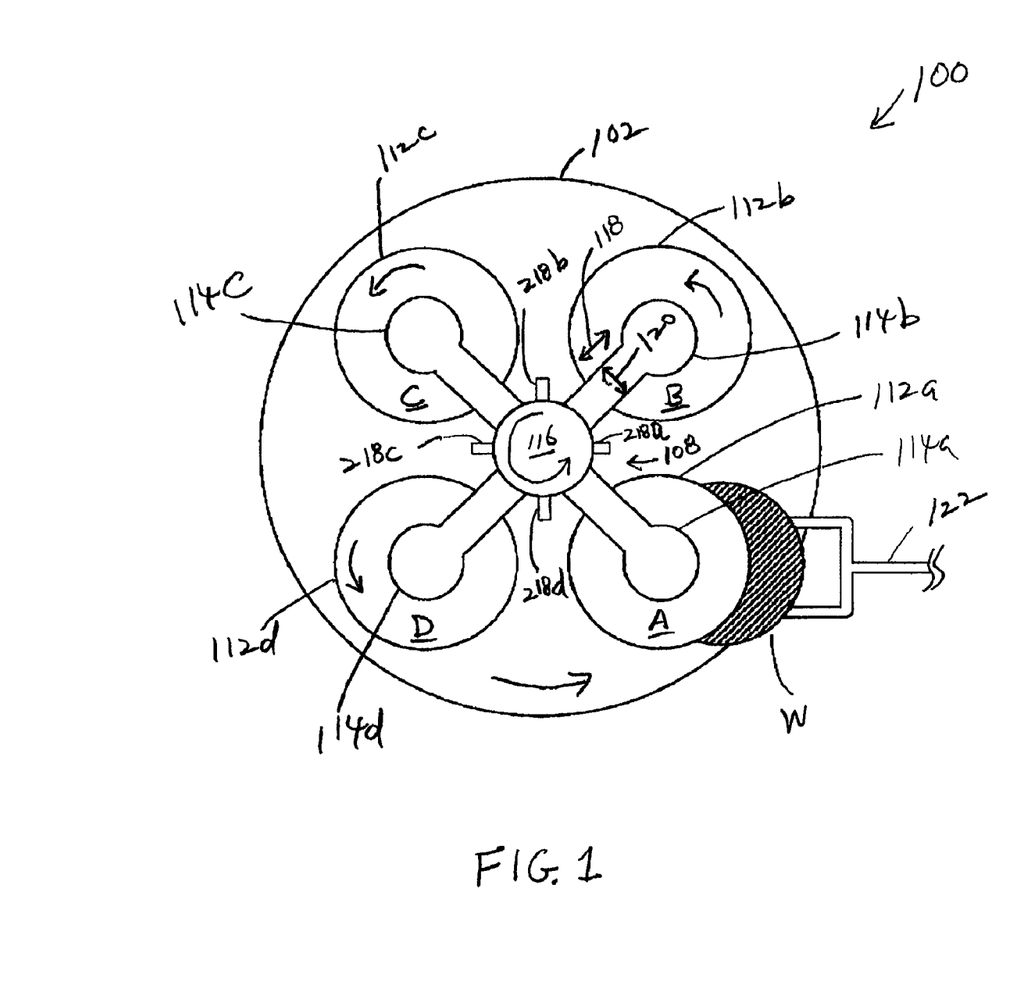
FIG. 1 is a top view of a chemical mechanical polishing (CMP) apparatus in accordance with the present invention.
Figure 2:
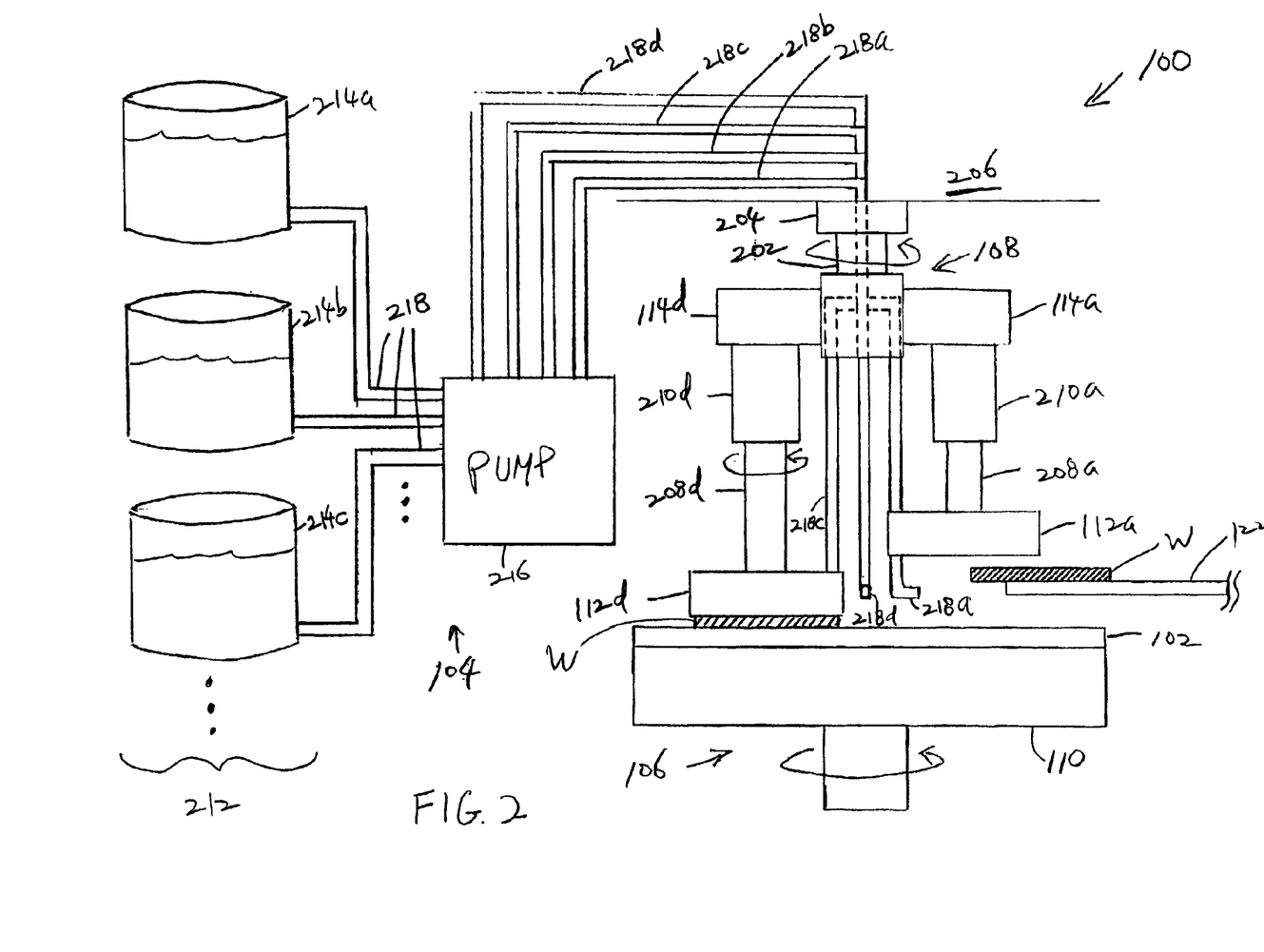
FIG. 2 is a side view of the CMP apparatus of FIG. 1.

With reference to FIGS. 1 and 2, a chemical mechanical polishing (CMP) apparatus 100 in accordance with the invention is shown. FIG. 1 is a top view of the CMP apparatus, while FIG. 2 is a side view of the apparatus. The CMP apparatus is designed to sequentially polish multiple semiconductor wafers W at different polishing positions A, B, C and D on a single polishing pad 102. The CMP apparatus utilizes a polishing solution delivery system 104 (not completely shown in FIG. 1) that allows one or more types of polishing solutions to be directed to the different polishing positions on the polishing pad. Thus, a given semiconductor wafer can be sequentially polished on the polishing pad using different types of polishing solutions. Consequently, the CMP apparatus eliminates the need to sequentially polish semiconductor wafers on a number of conventional CMP apparatuses when the wafers have to be repeatedly polished using different types of polishing solutions. Therefore, the CMP apparatus can effectively replace two or more conventional CMP apparatuses, which can significantly reduce the amount of space required in a cleanroom to perform sequential polishing of semiconductor wafers using different types of polishing solutions.

The CMP apparatus 100 includes a polishing pad assembly 106, a wafer transfer carousel 108, and the polishing solution delivery system 104. The polishing pad assembly comprises the polishing pad 102 and a rotatable base 110. The polishing pad is situated on the rotatable base, as illustrated in FIG. 2. Thus, the polishing pad can be rotated by rotating the base. The polishing pad may be any type of polishing pad that can be used to polish a surface of a semiconductor wafer. As an example, the polishing pad may be of the type that contains abrasive particles on the pad surface.

The wafer transfer carousel 108 of the CMP apparatus 100 includes four wafer carriers 112a, 112b, 112c and 112d, as illustrated in FIG. 1. Each of the wafer carriers can hold a single semiconductor wafer. Thus, the wafer transfer carousel can accommodate four semiconductor wafers at a time. The wafer transfer carousel further includes four carrier positioning arms 114a, 114b, 114c and 114d, which are connected to each other at a central connector 116. As illustrated in FIG. 2, the central connector is coupled to a central shaft 202, which is connected to a rotational drive mechanism 204. The rotational drive mechanism is affixed to an upper surface 206, which may be the housing of the CMP apparatus. In addition, each of the four wafer carriers is connected to one of the carrier positioning arms by a carrier shaft 208a, 208b, 208c or 208d and a rotational-and-vertical drive mechanism 210a, 210b, 210c or 210d. In FIG. 2, only the carrier shafts and 208a and 208d, and the rotational-and-vertical drive mechanisms 210a and 210d, which are connected to the wafer carriers 112a and 112d, are shown.

The rotational drive mechanism 204 of the wafer transfer carousel 108 operates to rotate the four carrier positioning arms 114a, 114b, 114c and 114d in either the clockwise direction or the counterclockwise direction. However, the rotational drive mechanism is illustrated and described herein as being configured to rotate the carrier positioning arms in the counterclockwise direction. Thus, each of the wafer carriers 112a, 112b, 112c and 112d of the wafer transfer carousel can be sequentially rotated to the polishing positions A, B, C and D on the polishing pad 102, which are shown in FIG. 1. Similar to the rotational drive mechanism, the rotational-and-vertical drive mechanisms 210a, 210b, 210c and 210d operate to independently rotate the connected wafer carriers. In addition, the rotational-and-vertical drive mechanisms operate to independently raise and lower the connected wafer carriers, so that the semiconductor wafers on the wafer carriers can be selectively lowered to engage the polishing pad 102.

In an alternative configuration, the central connector 116 of the wafer transfer carousel 108 includes an arm control mechanism (not shown) to selectively move the carrier positioning arms 114a, 114b, 114c and 114d. The arm control mechanism may be configured to extend and retract each of carrier positioning arms, as illustrated by the arrow 118 in FIG. 1. Furthermore, the arm control mechanism may be configured to oscillate each carrier positioning arm about the central connector, as illustrated by the arrow 120.

Although the wafer transfer carousel 108 is illustrated and described as being a carousel that can accommodate four semiconductor wafers, the wafer transfer carousel may alternatively be configured to accommodate two to eight or more semiconductor wafers. As an example, if the wafer transfer carousel is configured to accommodate five semiconductor wafers, then the wafer transfer carousel will include five wafer carriers that are connected to five carrier positioning arms.

The polishing solution delivery system 104 of the CMP apparatus 100 operates to supply one or more types of polishing solutions to the surface of the polishing pad 102. In particular, the polishing solution delivery system directs one or more types of polishing solutions to the polishing positions A, B, C and D of the polishing pad. Thus, when two different types of polishing solutions are directed to the polishing positions, one or more semiconductor wafers on the wafer transfer carousel 108 are polished using one type of polishing solution, while the other semiconductor wafers on the wafer transfer carousel are polished using a different type of polishing solution. The polishing solution delivery system includes a supply 212 of polishing solutions, which includes a number of polishing solution containers 214a, 214b and 214c, as illustrated in FIG. 2. Each polishing solution container can hold a different type of polishing solution. As an example, the polishing solution containers 214a and 214b may contain different types of slurries and the polishing solution container 214c may contain deionized water. The slurries contained in the polishing solution containers 214a and 214b may differ with respect to the size of abrasives or the chemicals in the slurries. Preferably, the slurries contained in the polishing solution containers 214a and 214b are chemically compatible, so that these slurries can be simultaneously used on the polishing pad 102 without an undesirable chemical reaction.

The polishing solution delivery system 104 further includes a pump 216 that is connected to the supply 212 of polishing solutions by a number of pipes 218. The pump operates to selectively deliver one or more types of polishing solutions from the supply 212 of polishing solutions to the surface of the polishing pad 102 via slurry delivery lines 218a, 218b, 218c and 218d. Preferably, the number of slurry delivery lines included in the polishing solution delivery system corresponds to the number of polishing positions on the polishing pad 102, which is same as the number of wafer carriers included in the wafer transfer carousel 108. Thus, in the current embodiment, as illustrated in FIGS. 1 and 2, the polishing solution delivery system includes four slurry delivery lines 218a, 218b, 218c and 218d from the pump to the surface of the polishing pad. Each of the slurry delivery lines is positioned to supply a polishing solution to one of the polishing positions A, B, C and D on the polishing pad, as the polishing pad is rotated.

Figure 3:
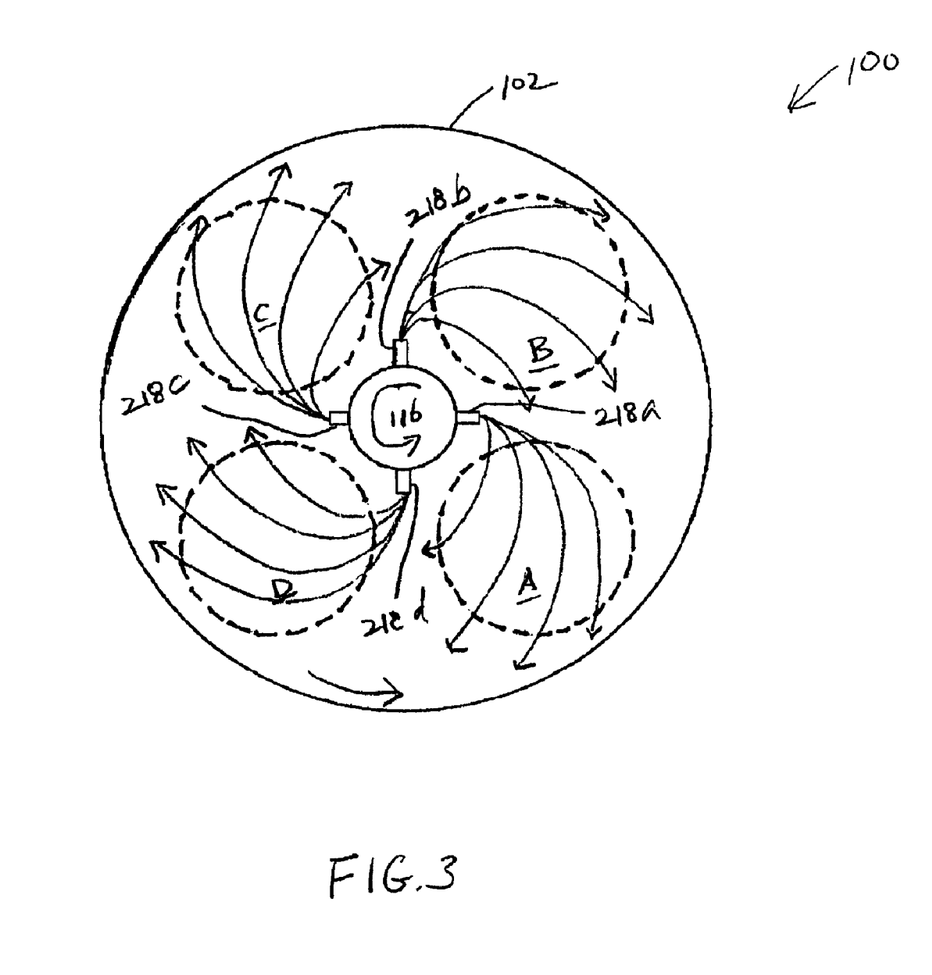
FIG. 3 is another top view of the CMP apparatus of FIG. 1, illustrating the paths of polishing solutions supplied to the surface of a polishing pad through multiple slurry delivery lines.

As illustrated in FIG. 3, the slurry delivery lines 218a, 218b, 218c and 218d are positioned to supply one or more types of polishing solutions to the polishing positions A, B, C and D, respectively. Specifically, each slurry delivery line is positioned to expel a particular polishing solution in an outwardly radial direction. FIG. 3 shows the general path of a polishing solution from each of the slurry delivery lines to a corresponding polishing position of the polishing pad 102. For clarity, only the central connector 116 of the wafer transfer carousel 108 is shown in FIG. 3. Furthermore, most of the polishing solution delivery system 104 is not shown in FIG. 3.

The slurry delivery lines 218a, 218b, 218c and 218d may be configured to rotate with the wafer transfer carousel 108. In such a configuration, the pump 216 of the polishing solution delivery system 108 may direct different types of polishing solutions to each of the slurry delivery lines, as the slurry delivery lines are rotated by the wafer transfer carousel. Thus, the type of polishing solution flowing through a particular slurry delivery line may vary, depending on the position of that slurry delivery line. In an alternative configuration, the slurry delivery lines may be configured to be stationary so that the rotation of the wafer transfer carousel does not affect the positions of the slurry delivery lines.

The exact combination of polishing solutions that are supplied to the polishing pad 102 through the slurry delivery lines 218a, 218b, 218c and 218d may vary according to the desired polishing effect. As an example, the slurry delivery lines 218a, 218b and 218c may supply a slurry with rough abrasives from the polishing solution container 214a so that semiconductor wafers can be intensely polished at the polishing positions A, B and C on the polishing pad, while the slurry delivery line 218d may supply a slurry with fine abrasives from the polishing solution container 2124b so that the wafers can then be polished to a smooth finish at the polishing position D on the polishing pad. As another example, the slurry delivery lines 218a, 218b and 218c may supply a first slurry for Cu polishing from the polishing solution container 214a so that Cu patterns on the semiconductor wafers are polished at the polishing positions A, B and C on the polishing pad, while the slurry delivery line 218d may supply a second slurry for Ta or TaN polishing from the polishing solution container 214c so that Ta or TaN patterns on the wafers can then be polished at the polishing position D on the polishing pad.

The CMP apparatus 100 polishes semiconductor wafers in phases, as described below. Since the CMP apparatus includes four wafer carriers that can be transferred to the four different polishing positions A, B, C and D, the polishing process includes four phases to polish a single semiconductor wafer. Each phase of the polishing process lasts a predefined period. The polishing process begins and ends at the position A. At the polishing position A, a polished semiconductor wafer is unloaded from a wafer carrier of the wafer transfer carousel 108 and a new semiconductor wafer is loaded onto that wafer carrier. The new semiconductor wafer is then polished at the polishing position A until the end of the predefined period. At each of the polishing positions B, C and D, the semiconductor wafer is further polished for the entire predefined period.

Figure 4:
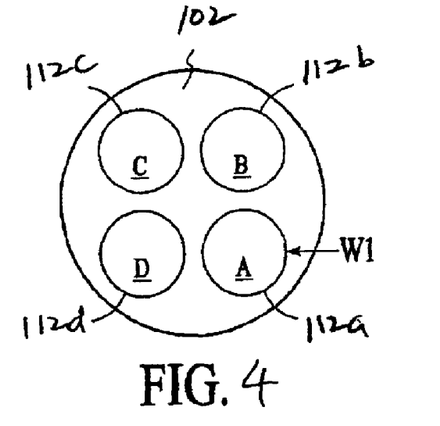
FIGS. 4–8 illustrate the operation of the CMP apparatus of FIGS. 1 and 2.

The operation of the CMP apparatus 100 is described with reference to FIGS. 1, 4, 5, 6, 7 and 8. In FIGS. 4–8, the polishing solution delivery system 104 of the CMP apparatus is not shown. Furthermore, only the wafer carriers 112a, 112b, 112c and 112d of the wafer transfer carousel 108 are shown. During a first phase, a semiconductor wafer W1 is loaded onto the wafer carrier of the wafer transfer carousel 108 that is currently situated at the polishing position A, which is illustrated in FIG. 4 as being the wafer carrier 112a. The semiconductor wafer W1 may be loaded onto the wafer carrier 112a using a wafer transport arm 122, as shown in FIGS. 1 and 2. The wafer transport arm may or may not be part of the CMP apparatus. The wafer transport arm operates to transfer a semiconductor wafer from an external source to the CMP apparatus for polishing. After the semiconductor wafer is polished, the wafer transport arm transfers the polished semiconductor wafer to an external destination. As an example, the external source and destination may be a wafer cassette.

Figure 5:
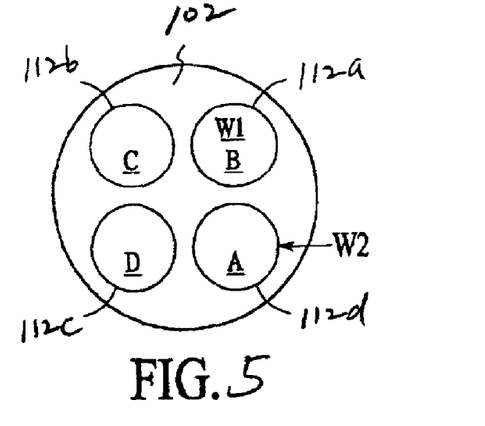
Figure 6:
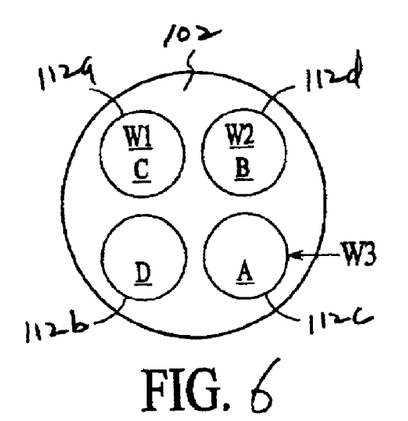
Figure 7:
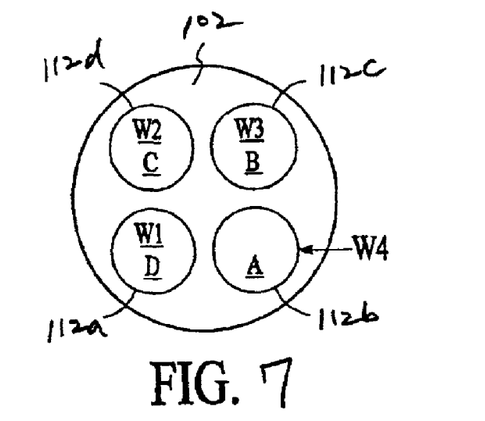
Figure 8:
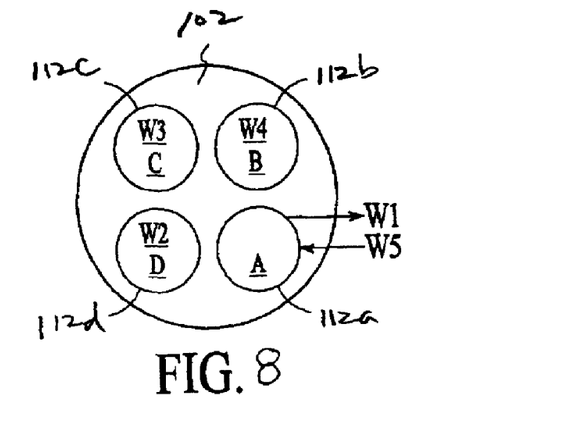

After the semiconductor wafer W1 is loaded onto the wafer carrier 112a, the wafer carrier 112a is lowered so that the wafer W1 contacts the polishing pad 102 to begin polishing. At the end of the predefined period, the wafer transfer carousel 108 is rotated so that the wafer carrier 112a is now situated at the polishing position B, as illustrated in FIG. 5, which begins the next phase. During a second phase, the semiconductor wafer W1 is further polished at the polishing position B by the wafer carrier 112a. Meanwhile, the wafer carrier 112d, now at position A, is loaded with a second semiconductor wafer W2 by the wafer transport arm 122. The semiconductor wafer W2 is then lowered to begin polishing. After another predefined period, the wafer transfer carousel is rotated so that the wafer carrier 112a is now situated at polishing position C, as illustrated in FIG. 6, which begins the next phase. During a third phase, the semiconductor wafers W1 and W2 are further polished at the polishing positions C and B, respectively. The wafer carrier 112c, now at the polishing position A, is loaded with a third semiconductor wafer W3 by the wafer transport arm. The semiconductor wafer W3 is then lowered to begin polishing. After another predefined period, the wafer transfer carousel is rotated so that the wafer carrier 112a is now situated at the polishing position D, as illustrated in FIG. 7, which begins the next phase. During a fourth phase, the semiconductor wafers W1, W2 and W3 are further polished at the polishing positions D, C and B, respectively. The wafer carrier 112b, now at polishing position A, is loaded with a fourth semiconductor wafer W4 by the wafer transport arm. The semiconductor wafer W4 is then lowered to begin polishing. After another predefined period, the wafer transfer carousel is rotated so that the wafer carrier 112a is now back at the polishing position A, as illustrated in FIG. 8, which begins the next phase. At this point, the semiconductor wafer W1 has been polished at each of the polishing positions A, B, C and D, which completes the polishing process for the wafer W1.

During this next phase, the semiconductor wafers W2, W3 and W4 on the wafer carriers 112d, 112c and 112b are further polished at the polishing positions D, C and B, respectively. Meanwhile, the semiconductor wafer W1 is unloaded from the wafer carrier 112a by the wafer transport arm 122. After the wafer W1 is unloaded, a fifth semiconductor wafer W5 is loaded onto the wafer carrier 112a, and the process is continued. In this fashion, three semiconductor wafers are continuously polished at each of the polishing positions B, C and D, as semiconductor wafers are loaded, unloaded and polished at the polishing position A.

Since the semiconductor wafers are exclusively polished on the single polishing pad 102, the wafers can be continuously polished during the transfer of the wafer carriers 112a, 112b, 112c and 112d to subsequent polishing positions. Thus, the semiconductor wafers do not have to be lifted when the wafer carriers are being transferred to the different polishing positions, which would be the case if one or more of the polishing positions A, B, C and D are located on a different polishing pad. Consequently, the entire processing time of the CMP apparatus 100 is significantly reduced, when compared to a conventional CMP apparatus with multiple polishing pads. In addition, since the semiconductor wafers are in contact with the polishing pad during the entire polishing process, the semiconductor wafers are ensured to remain attached to the wafer carriers during the polishing process.

In an alternative polishing process, the polishing of a semiconductor wafer on a wafer carrier of the wafer transfer carousel 108 at the polishing position A is performed before unloading and loading. Thus, in this polishing process, the last polishing step for a semiconductor wafer is performed when the wafer carrier is transferred back to the polishing position A. Consequently, the first polishing step for the semiconductor wafer is performed when the wafer is transferred from the polishing position A to the polishing position B.

Figure 9:
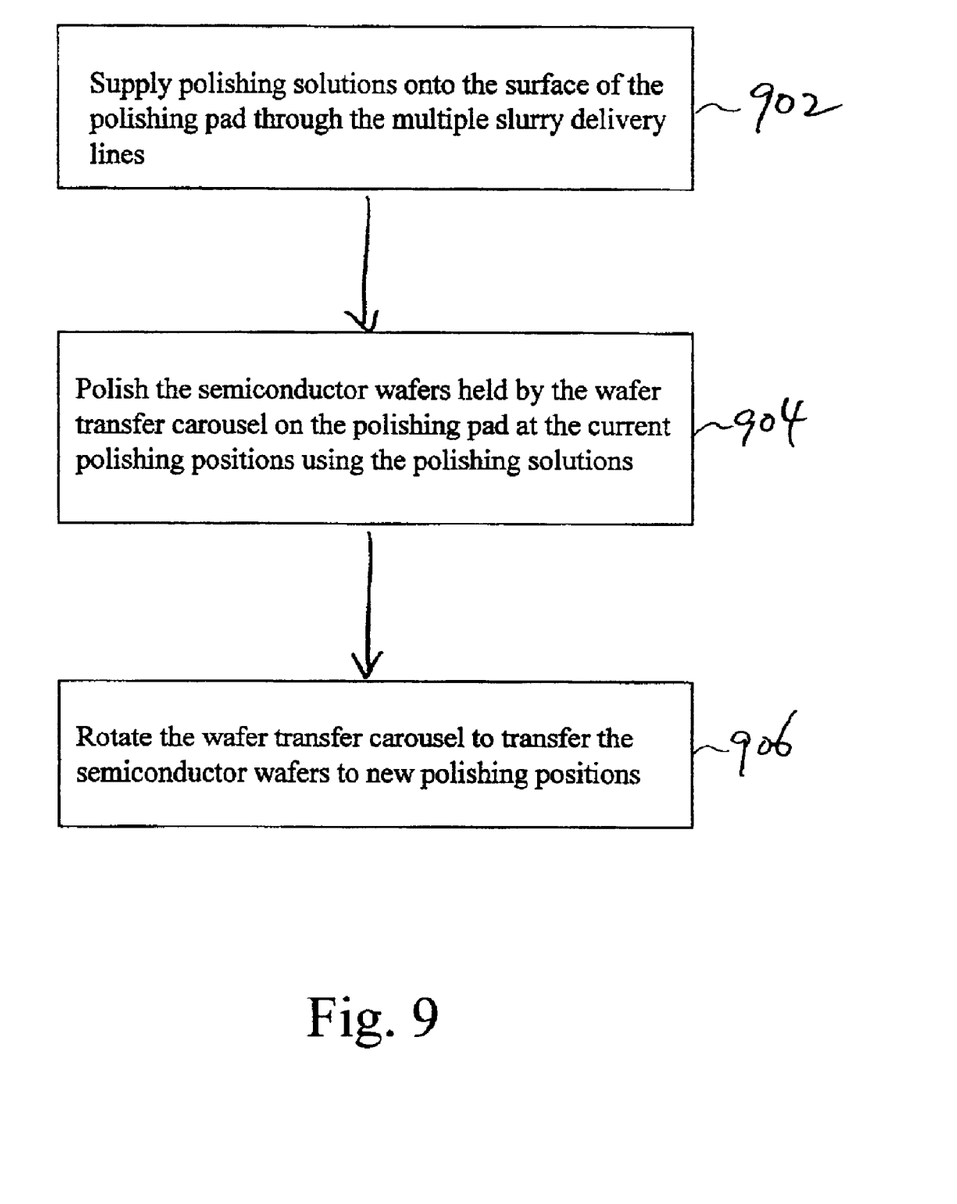
FIG. 9 is a process flow diagram of a method of polishing semiconductor wafers in accordance with the present invention.

A method of polishing semiconductor wafers in accordance with the invention is described with reference to the process flow diagram of FIG. 9. At step 902, polishing solutions are supplied onto the surface of the polishing pad 102 near the polishing positions A, B, C and D of the polishing pad through the multiple slurry delivery lines 218a, 218b, 218c and 218d. Each slurry delivery line can supply a particular polishing solution from the supply 212 of polishing solutions. Thus, one to four different types of polishing solutions can be supplied to the surface of the polishing pad through the slurry delivery lines. Next, at step 904, the semiconductor wafers held by the wafer carriers 112a, 112b, 112c and 112d of the wafer transfer carousel 108 are polished on the polishing pad at the current polishing positions using the polishing solutions that are supplied to the surface of the polishing pad through the slurry delivery lines. At step 906, the wafer transfer carousel is rotated so that each semiconductor wafer on the wafer carriers is transferred to the next polishing position on the polishing pad. If the slurry delivery lines are stationary, then each slurry delivery line may continuously supply a particular polishing solution from the supply of polishing solutions to a corresponding polishing position on the polishing pad. However, if the slurry delivery lines rotate with the wafer transfer carousel, then one or more slurry delivery lines may supply a different polishing solution from the supply of polishing solutions when the slurry delivery lines are rotated to new positions. In this fashion, semiconductor wafers are sequentially polished at each of the polishing positions on the polishing pad using one or more types of polishing solutions supplied to the surface of the polishing pad through the slurry delivery lines.

Although a specific embodiment of the invention has been described and illustrated, the invention is not to be limited to the specific forms or arrangements of parts so described and illustrated. The scope of the invention is to be defined by the claims appended hereto and their equivalents.

What is claimed is:

1. An apparatus for polishing objects comprising:
    a polishing pad having a surface to polish said objects where said polishing pad includes a plurality of polishing positions;
    a rotatable object transfer mechanism having a plurality of object carriers, each of said object carriers being configured to hold at least one of said objects, said object transfer mechanism being configured to move said object carriers to each of said polishing positions of said polishing pad; and
    a plurality of delivery lines that extend to said surface of said polishing pad, said delivery lines being connected to a polishing solution supply, each of said delivery lines being positioned to supply a particular polishing solution from said polishing solution supply to said surface of said polishing pad.

2. The apparatus of claim 1 wherein said object transfer mechanism is a carousel that is configured to rotate said object carriers to said polishing positions of said polishing pad.

3. The apparatus of claim 1 wherein each of said delivery lines is positioned to direct said particular polishing solution toward a corresponding polishing position of said polishing pad so that said particular polishing solution is distributed to said corresponding polishing position as said polishing pad is being rotated.

4. The apparatus of claim 1 wherein said polishing solution supply includes a polishing solution selected from a group consisting of slurry and deionized water.

5. The apparatus of claim 1 wherein said polishing solution supply includes a first type of slurry and a second type of slurry.

6. The apparatus of claim 5 wherein said second type of slurry has finer abrasives than said first type of slurry.

7. The apparatus of claim 5 wherein said first type of slurry and said second type of slurry are chemically compatible so that said first type of slurry and said second type of slurry can be simultaneously used on said polishing pad without an undesirable chemical reaction.

8. The apparatus of claim 1 wherein the number of said delivery lines corresponds to the number of said object carriers of said object transfer mechanism.

9. The apparatus of claim 1 wherein each of said delivery lines is positioned to expel said particular polishing solution in an outwardly radial direction onto said surface of said polishing pad.

10. A method of polishing objects comprising:
supplying polishing solutions onto a surface of a polishing pad of an apparatus near polishing positions of said polishing pad through a plurality of delivery lines, said delivery lines being connected to a polishing solution supply to carry said polishing solutions from said polishing solution supply to said surface of said polishing pad, each of said delivery lines being positioned to deliver a particular polishing solution to said surface of said polishing pad; and
polishing said objects at said polishing positions of said polishing pad using said polishing solutions that are supplied to said surface of said polishing pad through said delivery lines wherein said objects are delivered to the polishing positions using a rotatable object transfer mechanism having a plurality of object carriers.

11. The method of claim 10 further comprising a step of transferring each of said objects from a first position of said polishing positions to a second position of said polishing positions so that said objects are polished at said first and second positions.

12. The method of claim 11 wherein said step of transferring each of said objects includes rotating said objects about said polishing pad to said first and second positions of said polishing pad.

13. The method of claim 10 wherein said step of supplying said polishing solutions includes selectively directing said particular polishing solution to a specific polishing position of said polishing positions of said polishing pad.

14. The method of claim 10 wherein said polishing solutions include a polishing solution selected from a group consisting of slurry and deionized water.

15. The method of claim 10 wherein said step of supplying said polishing solutions onto said surface of said polishing pad includes:
supplying a first type of slurry onto said surface of said polishing pad through a first delivery line of said delivery lines; and
supplying a second type of slurry onto said surface of said polishing pad through a second delivery line of said delivery lines.

16. The method of claim 15 wherein said second type of slurry has finer abrasives than said first type of slurry.

17. The method of claim 15 wherein said first type of slurry and said second type of slurry are chemically compatible so that said first type of slurry and said second type of slurry can be simultaneously used on said polishing pad without undesirable chemical reaction.

18. The method of claim 10 wherein the number of said delivery lines corresponds to the number of said polishing positions.

19. The method of claim 10 wherein said step of supplying said polishing solutions onto said surface of said polishing pad includes expelling said polishing solutions in an outwardly radial direction onto said surface of said polishing pad through said delivery lines.

20. An apparatus for polishing semiconductor objects comprising:
a polishing pad having a surface to polish said semiconductor objects, said polishing pad being configured to rotate in a predetermined direction;
an object transfer carousel having a plurality of object carriers, each of said object carriers being configured to hold at least one of said semiconductor objects, said object transfer carousel being configured to move said object carriers to different polishing positions of said polishing pad; and
a plurality of delivery lines that are positioned to supply polishing solutions to said surface of said polishing pad, said delivery lines being connected to a polishing solution supply to receive said polishing solutions from said polishing solution supply, each of said delivery lines being positioned to deliver a specific polishing solution onto said surface of said polishing pad near a particular position of said polishing positions of said polishing pad such that said specific polishing solution is substantially distributed to said particular polishing position by the rotation of said polishing pad.

21. The apparatus of claim 20 wherein said polishing solution supply includes a polishing solution selected from a group consisting of slurry and deionized water.

22. The apparatus of claim 20 wherein said polishing solution supply includes a first type of slurry and a second type of slurry.

23. The apparatus of claim 22 wherein said second type of slurry has finer abrasives than said first type of slurry.

24. The apparatus of claim 22 wherein said first type of slurry and said second type of slurry are chemically compatible so that said first type of slurry and said second type of slurry can be simultaneously used on said polishing pad without an undesirable chemical reaction.

25. The apparatus of claim 1 wherein each of said delivery lines is positioned to expel said specific polishing solution in an outwardly radial direction onto said surface of said polishing pad.

* * * * *